United States Patent
Smith et al.

(10) Patent No.: US 7,290,118 B2
(45) Date of Patent: Oct. 30, 2007

(54) ADDRESS CONTROL SYSTEM FOR A MEMORY STORAGE DEVICE

(75) Inventors: Kenneth Kay Smith, Boise, ID (US); Sarah Morris Brandenberger, Boise, ID (US); Terrel Munden, Boise, ID (US); Frederick A. Perner, Palo Alto, CA (US); Connie Lemus, Boise, ID (US); David McIntyre, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 360 days.

(21) Appl. No.: 10/754,663

(22) Filed: Jan. 8, 2004

(65) Prior Publication Data

US 2005/0154842 A1    Jul. 14, 2005

(51) Int. Cl.
*G06F 12/00* (2006.01)

(52) U.S. Cl. .................. 711/219; 711/154; 365/230.04

(58) Field of Classification Search ................ 711/154, 711/201, 219; 365/230.04
See application file for complete search history.

(56) References Cited

U.S. PATENT DOCUMENTS

| 5,493,535 | A  | * | 2/1996  | Cho ...................... 365/230.04 |
| 5,717,706 | A  | * | 2/1998  | Ikeda ......................... 714/786 |
| 5,986,925 | A  |   | 11/1999 | Naji et al. |
| 6,052,302 | A  |   | 4/2000  | Moyer et al. |
| 6,191,997 | B1 | * | 2/2001  | Son et al. .............. 365/230.04 |
| 6,215,707 | B1 |   | 4/2001  | Moyer |
| 6,292,868 | B1 | * | 9/2001  | Norman ..................... 711/103 |
| 6,363,000 | B2 |   | 3/2002  | Perner et al. |
| 2001/0038548 | A1 |  | 11/2001 | Perner et al. |
| 2002/0021543 | A1 |  | 2/2002  | Gogl et al. |

* cited by examiner

*Primary Examiner*—Pierre-Michel Bataille

(57) ABSTRACT

A memory storage device having an address control system is disclosed. The memory storage device includes memory cells and an address control system configured to decode a bit number which identifies a number of the memory cells which are selected in parallel. The memory cells selected in parallel correspond to least significant bits of an address which has a range that includes the memory cells.

18 Claims, 7 Drawing Sheets

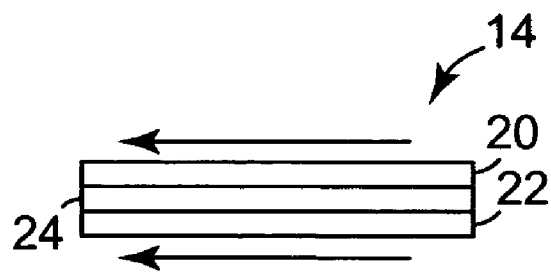
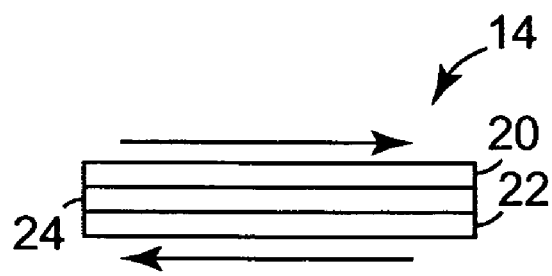
Fig. 2A  Fig. 2B
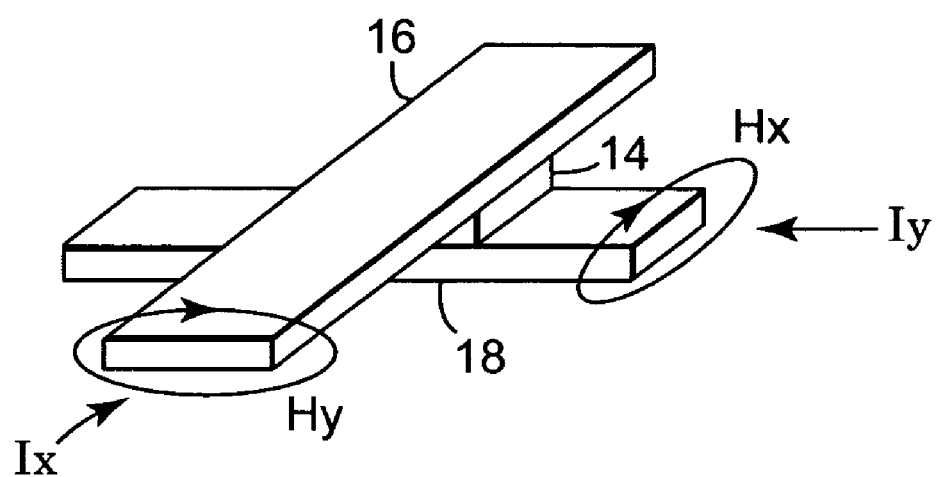
Fig. 3

| | C0 | C1 | C2 | C3 | C4 | C5 | C6 | C7 | C8 | C9 | C10 | C11 | C12 | C13 | C14 | C15 |
|---|---|---|---|---|---|---|---|---|---|---|---|---|---|---|---|---|
| A0 | 0 | 1 | 0 | 1 | 0 | 1 | 0 | 1 | 0 | 1 | 0 | 1 | 0 | 1 | 0 | 1 |
| A1 | 0 | 0 | 1 | 1 | 0 | 0 | 1 | 1 | 0 | 0 | 1 | 1 | 0 | 0 | 1 | 1 |
| A2 | 0 | 0 | 0 | 0 | 1 | 1 | 1 | 1 | 0 | 0 | 0 | 0 | 1 | 1 | 1 | 1 |
| A3 | 0 | 0 | 0 | 0 | 0 | 0 | 0 | 0 | 1 | 1 | 1 | 1 | 1 | 1 | 1 | 1 |
| 1 | 1 | 1 | | | | | | | | | | | | | | |
| 2 | | | 1 | 1 | | | | | | | | | | | | |
| 3 | | | | | 1 | 1 | | | | | | | | | | |
| 4 | | | | | | | 1 | 1 | | | | | | | | |
| 5 | | | | | | | | | 1 | 1 | | | | | | |
| 6 | | | | | | | | | | | 1 | 1 | | | | |
| 7 | | | | | | | | | | | | | 1 | 1 | | |
| 8 | | | | | | | | | | | | | | | 1 | 1 |

Fig. 8

ADDRESS CONTROL SYSTEM FOR A MEMORY STORAGE DEVICE

BACKGROUND OF THE INVENTION

One type of memory storage device is a magnetic random access memory (MRAM). MRAM is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is usually written to a desired logic state by applying external magnetic fields that rotate the orientation of magnetization in its data storage layer. The logic state of a magnetic memory cell is indicated by its resistance state which depends on the relative orientations of magnetization in its data storage and reference layers. A sense amplifier is used to sense the resistance state of a selected magnetic memory cell to determine the logic state stored in the memory cell.

Traditionally, memory arrays have been designed for applications which require high data transfer rates or low power consumption. For applications requiring high data transfer rates, parallel designs which increase the number of input/output ports can be used or the operating speed of the memory arrays can be increased. With either of these approaches, the higher data transfer rates result in increased power consumption. Once the physical design of the memory is optimized for a particular application, such as one requiring high data transfer rates, the memory may not be suitable for other applications.

Recently, low-cost and portable devices such as personal digital assistants (PDAs) have been made possible by improvements in technology which have reduced their weight and capacity to store information. The PDAs can be used to store frequently used information such as daily appointments, task lists, and telephone contact information. This information is typically retrieved in small amounts as needed from the PDA in situations where power for the PDA is supplied by batteries.

The PDAs are able to exchange information with personal computers for the purpose of backup data storage. The backup data storage activity transfers a significant amount of information to the personal computer so high data transfer rates are desirable. The backup data storage is usually performed in an environment such as at a home or office where power receptacles are readily available to supply power to the PDA.

SUMMARY OF THE INVENTION

The present invention provides a memory storage device having an address control system. In one embodiment the memory storage device includes memory cells and an address control system configured to decode a bit number which identifies a number of the memory cells which are selected in parallel. The memory cells selected in parallel correspond to least significant bits of an address which has a range that includes the memory cells.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 2A and 2B are diagrams illustrating parallel and anti-parallel magnetization of a magnetic memory cell.

FIG. 3 is a diagram illustrating a magnetic memory cell that has been selected.

FIG. 8 is a diagram illustrating one embodiment of a bit number decoded into column enable outputs.

DETAILED DESCRIPTION

Figure 1:
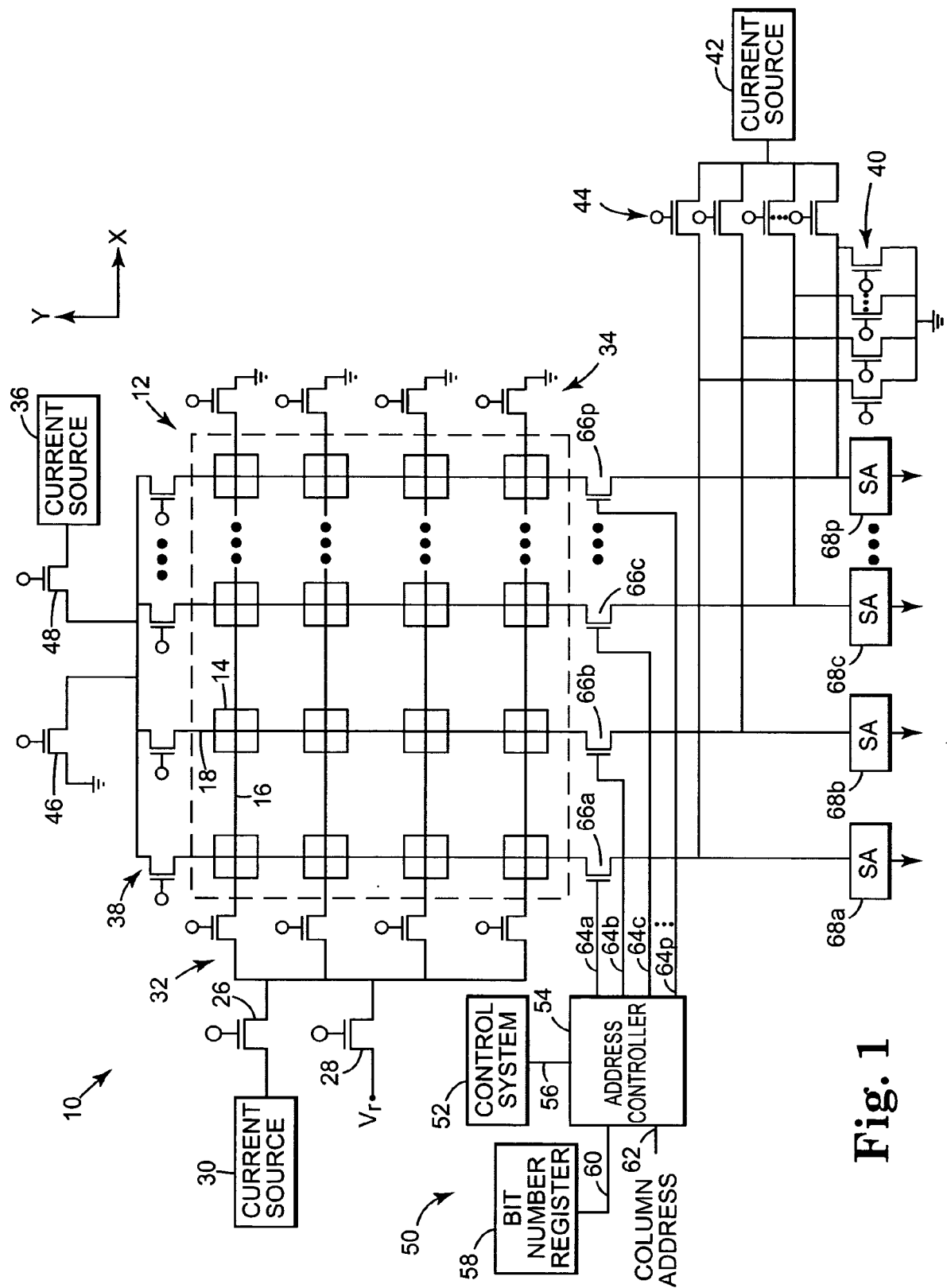
FIG. 1 is a diagram illustrating an exemplary embodiment of a memory storage device according to the present invention.

FIG. 1 is a diagram illustrating an exemplary embodiment of a memory storage device 10 according to the present invention. The memory storage device 10 is operable in a low power mode to save power and in a high speed mode for high data transfer rates. In the exemplary embodiment, the memory storage device 10 includes magnetic memory cells 14 and is alternately referred to as a magnetic memory 10. The memory cells 14 are arranged in rows and columns, with the rows extending along an x-direction and the columns extending along a y-direction. Only a relatively small number of magnetic memory cells 14 are shown to simplify the description of the invention. In other embodiments, the array 12 is any suitable size.

In one embodiment, word lines 16 extend along the x-direction in a plane on one side of array 12 and bit lines 18 extend along the y-direction in a plane on an adjacent side of array 12. In one embodiment, there is one word line 16 for each row of array 12 and one bit line 18 for each column of array 12. In the embodiment illustrated in FIG. 1, magnetic memory cell 14 is located at an intersection or cross point of a word line 16 and a bit line 18.

The magnetic memory cells 14 are not limited to any particular type of device. Magnetic memory cells 14 may be, for example, spin dependent tunneling junction devices or, magnetoresistance devices.

In one embodiment, MRAM device 10 includes a row decoder and a column decoder which are not shown to simplify the illustration of the invention. A control system 52 controls the row decoder during read and write operations. The row decoder is coupled to the gates of switching transistors 32 and switching transistors 34, and turns off (opens) and turns on (closes) switching transistors 32 and switching transistors 34 in accordance with instructions received from control system 52. Control system 52 is also coupled to the column decoder to control the column decoder during read and write operations. The column decoder is coupled to the gates of switching transistors 38 and switching transistors 40, and opens and closes switching transistors 38 and switching transistors 40 in accordance with instructions received from control system 52.

During a write operation, to supply a word line write current, switching transistors 32 and switching transistor 26 selectively couple word lines 16 to an output of current source 30 which provides a row write current $I_x$. Switching transistors 34 selectively couple word lines 16 to ground. To supply a bit line write current in a first direction, switching transistors 38 and switching transistor 48 selectively couple a first end of bit lines 18 to an output of current source 36 which provides a column write current $I_y$ in the first direction. Switching transistors 66 and switching transistors 40 selectively couple a second end of bit lines 18 to ground. To supply a bit line write current in a second direction, switching transistors 66 and switching transistors 44 selectively couple a first end of bit lines 18 to an output of current source 42 which provides a column write current $I_y$ in the second direction. Switching transistors 38 and switching transistor 46 selectively couple a second end of bit lines 18 to ground.

During a read operation, switching transistors 32 and switching transistor 28 selectively couple one end of word lines 16 to a read voltage source $V_r$. Switching transistors 34 selectively couple the other end of word lines 16 to ground. Switching transistors 38 are opened to isolate one end of the bit lines 18 and switching transistors 66 selectively couple the other end of the bit lines 18 to sense amplifiers 68.

In the exemplary embodiment, magnetic memory cell 14 can store two logic states which correspond to a logical "0" or to a logical "1". In a first embodiment to illustrate writing magnetic memory cell 14, the row write current $I_x$ is supplied from current source 30 via switching transistor 26 and a selected switching transistor 32 to a selected word line 16, through a selected switch transistor 34 to ground. To write a logical "0", the column write current $I_y$ is supplied from current source 36 via switching transistor 48 and selected switching transistors 38 to selected bit lines 18, through selected switching transistors 66 and switching transistors 40 to ground. To write a logical "1", the column write current $I_y$ is supplied from current source 42 via switching transistors 44 and selected switching transistors 66 to selected bit lines 18, through selected switching transistors 38 and switch transistor 46 to ground.

In a second embodiment to illustrate writing magnetic memory cell 14, the row write current $I_x$ is supplied from current source 30 via switching transistor 26 and a selected switching transistor 32 to a selected word line 16, through a selected switch transistor 34 to ground. To write a logical "1", the column write current $I_y$ is supplied from current source 36 via switching transistor 48 and selected switching transistors 38 to selected bit lines 18, through selected switching transistors 66 and switching transistor 40 to ground. To write a logical "0", the column write current $I_y$ is supplied from current source 42 via switching transistors 44 and selected switching transistors 66 to selected bit lines 18, through selected switching transistors 38 and switch transistor 46 to ground.

In the exemplary embodiment, address control system 50 includes address controller 54 and bit number register 58. Bit number register 58 is coupled to address controller 54 via line 60. Bit number register 58 stores a bit number which is equal to the number of bit lines 18 which are accessed in parallel. Address controller 54 is controlled by control system 52 and is coupled to control system 52 via line 56. Address controller 54 has column address inputs at 62 and provides column enable outputs at 64. The column enable outputs at 64 selectively turn on transistors 66 to select individual bit lines 18.

The address control system 50 is configured to select memory cells 14 in parallel by decoding the bit number stored in bit number register 58. The bit number is used to select the memory cells 14 which correspond to least significant bits of the column address input at 62. The column address has an address range that includes the memory cells 14.

In one embodiment, address controller 54 converts the bit number at 60 and the column address at 62 into column enable outputs. In this embodiment, the bit number provided at line 60 selects corresponding least significant bits of the column address which are decoded to enable column enable outputs 64 and corresponding bit lines 18.

In another embodiment, the bit number provided at line 60 selects corresponding least significant bits of a row address which are decoded to enable word lines 16.

In other embodiments of the invention, other memory storage devices using other memory cell types can be used. The memory storage devices include, but are not limited to, static random access memory (SRAM), dynamic random access memory (DRAM), ferroelectric random access memory (FRAM), electrically erasable programmable read-only memory (EEPROM) and flash EEPROM.

In various embodiments, the memory cells can include fuse elements or anti-fuse elements. In one embodiment, anti-fuse elements are used wherein the anti-fuse elements include tunnel junction elements. The tunnel junction elements are formed using an oxide layer which includes any suitable electrically insulating material such as oxide-nitride-oxide (ONO), tantalum pentoxide ($Ta_2O_5$), plasma enhanced silicon nitride (P-$SiN_x$), titanium oxide, germanium oxide, or any chemical vapor deposition (CVD) dielectric including a deposited oxide, a grown oxide or other suitable dielectric material. In one embodiment, the oxide layer utilizes electron tunneling to change the resistance of the memory cells between the first resistance value and the second resistance value when the memory cells are being programmed. In other embodiments, the oxide layer can be processed to be a dielectric breakdown device rather than a tunnel junction device.

In one embodiment, the memory cells use phase-change materials for a read/writeable (or write/erase/write) state-change layer. In one embodiment, germanium telluride (GeTe) is used. GeTe can be reversibly changed from a semiconducting (amorphous) state to a metallic (crystalline) state by undergoing heating and cooling steps at a suitable rate. In other embodiments, other phase-change materials can be used which include, but are not limited to, chalcogenide alloys such as GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$ and GeSbTe.

In one embodiment, the memory cells include alternative state-change technologies. In one embodiment, the memory cells include LeComber switches which are formed by depositing a thin layer of amorphous intrinsic silicon over metallic conductors such as word lines 16 or bit lines 18. After the thin layer of amorphous intrinsic silicon is deposited, a separate metal such as gold (Ag) is deposited over the layer of amorphous intrinsic silicon. The LeComber switch performs as a reversed biased tunnel diode before being programmed. The LeComber switch is programmed by creating an enhanced concentrated electric field through the amorphous silicon to form a conductive path.

In one embodiment, the memory cells include silicide switches which are formed by stacking alternating silicon and transition metal thin films so that the alternating films exhibit a changed resistance when programmed. Generally, the programming process for a silicide switch is irreversible. Before writing, the stacked silicon and transaction metal layers have a first resistance. Suitable word lines 16 and bit lines 18 are selected to force a current through a selected memory cell. The current passing through the selected memory cell creates Joule heat which triggers and completes the silicidation reaction. By applying a concentrated electric field, the current is focused and the Joule heat is concentrated in a small area which allows the programming to be completed. The silicidation reaction causes the resistance of the selected memory cell to change to a lower value. In various embodiments, suitable silicide compounds can be used which include, but are not limited to, $Ni_2Si$, NiSi, $NiSi_2$, Pd2Si, PdSi, and $Pt_2Si$, and PtSi.

FIGS. 2A and 2B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel-barrier 24 disposed between data storage layer 20 and reference layer 22. Data storage layer 20 is referred to as a free layer because it has a magnetization orientation that is not pinned and which can be oriented in either of two directions along an easy axis which lies in a plane. Reference layer 22 is referred to as a pinned layer because it has a magnetization that is oriented in a plane but is fixed so as not to rotate in the presence of an applied magnetic field within a range of interest. The magnetization orientation assumes one of two stable orientations at any given time which are the parallel and anti-parallel orientations.

FIG. 2A illustrates by arrows the parallel orientation when the magnetization of the free and pinned layers 20 and 22 are in the same direction along the easy axis. With parallel orientation, the orientation of magnetization in the data storage layer 20 is substantially parallel to the magnetization in the reference layer 22 along the easy axis and magnetic memory cell 14 is in a low resistance state which can be represented by the value R. FIG. 2B illustrates by arrows the anti-parallel orientation when the magnetization of the free and pinned layers 20 and 22 are in opposite directions. With anti-parallel orientation, the orientation of magnetization in the data storage layer 20 is substantially anti-parallel to the magnetization in the reference layer 22 along the easy axis and magnetic memory cell 14 is in a high resistance state which can be represented by the value $R+\Delta R$. The insulating tunnel barrier 24 allows quantum mechanical tunneling to occur between the free and pinned layers 20 and 22. Because the tunneling is electron spin dependent, the resistance of magnetic memory cell 14 is a function of the relative orientations of the magnetization of the free and pinned layers 20 and 22.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

FIG. 3 is a diagram illustrating a magnetic memory cell 14 that has been selected. In one embodiment, the magnetization in free layer 20 of selected magnetic memory cell 14 is oriented by supplying the currents Ix and Iy to conductors 16 and 18 which cross selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 cause the magnetization of free layer 20 to rotate from the parallel orientation to the anti-parallel orientation, or to rotate from the anti-parallel orientation to the parallel orientation.

In one embodiment, a magnetic memory cell 14 is read by applying sense currents to word line 16 and bit line 18. Magnetic memory cell 14 will have either a resistance of R or a resistance of $R+\Delta R$, depending on whether the orientation of magnetization of the free and pinned layers 20 and 22 is parallel or anti-parallel as illustrated in FIGS. 2A and 2B.

Figure 4:
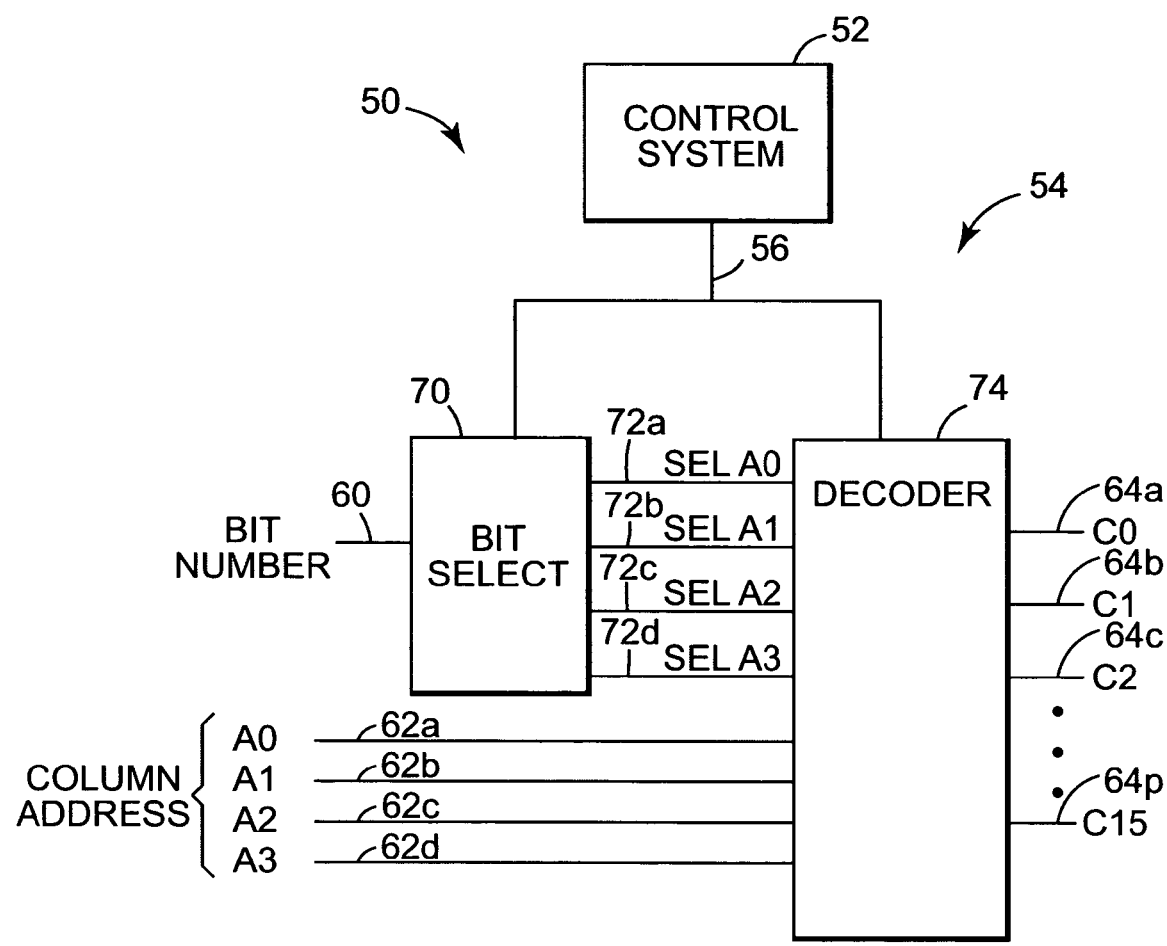
FIG. 4 is a diagram illustrating an exemplary embodiment of an address controller.

FIG. 4 is a diagram illustrating an exemplary embodiment of an address controller 54. In the exemplary embodiment, address controller 54 is coupled to control system 52 via line 56. Address controller 54 includes a bit select logic circuit 70 and a decoder circuit 74. Bit select logic circuit 70 decodes the bit number provided at 60 into address select bits at 72 which are provided as inputs to decoder circuit 74. The four address select bit outputs are illustrated as SEL A0 at 72a, SEL A1 at 72b, SEL A2 at 72c and SEL A3 at 72d.

Decoder circuit 74 has column address inputs A0 at 62a, A1 at 62b, A2 at 62c and A3 at 62d. Decoder circuit 74 is configured to decode the column address bits A0 through A3 and the address select bits SEL A0 through SEL A3 into column enable outputs illustrated as C0 at 64a through C15 at 64p.

In the exemplary embodiment, four column address bits at 62 and four address select bits at 72 are decoded into 16 column enable outputs at 64. In other embodiments, any suitable number of column address bit inputs, address select bit inputs and column enable outputs can be used.

In the exemplary embodiment, the bit number at line 60 is equal to two, four, eight or 16 and enables, respectively, two, four, eight or 16 column enable outputs simultaneously. In one embodiment, bit number is equal to two raised to a power. In the exemplary embodiment, the power is one, two, three or four so that the number of column address combinations which are necessary to select all of the column enable outputs is an even multiple of the number of all of the column enable outputs.

In one embodiment, a low data transfer rate and low power consumption are selected for magnetic memory 10 and the bit number is equal to one. In this embodiment, only one column enable output 64 of decoder 74 is enabled and only one bit line 18 is selected to conduct a current from current source 36 or current source 42. When the bit number is equal to one, bit select 70 enables none of the address select bit outputs at 72. Decoder 74 provides outputs which are selected by column address A0-A3. In this embodiment, each combination of address inputs A0-A3 at line 62 selects one column enable output at 64. Column enable output C0 at line 64a is enabled when the column address A0-A3 at 62 is equal to "0000". As the column address A0-A3 is incremented in a binary count, with A0 as the least significant bit and A3 as the most significant bit, the column enable output C2 at line 64b is next enabled. Similarly, the remaining column enable outputs C3 through C15 are selected individually as the column address A0-A3 is incremented using the binary count with A0 as the least significant bit and A3 as the most significant bit.

In a second example embodiment, the bit number at line 60 is equal to two and bit select circuit 70 enables SEL A0 at line 72a. SEL A0 corresponds to the least significant bit A0 of the column address at line 62a. Once SEL A0 is enabled, the column enable outputs at 64 are selected by the remaining column address bits A1-A3. In this embodiment, each combination of address inputs A1-A3 at line 62 selects two column enable outputs at 64. Column enable outputs C0 and C1 at line 64a and 64b, respectively, are enabled when column address A1-A3 at 62 is equal to "000". As the column address A1-A3 is incremented in a binary count, with A1 as the least significant bit and A3 as the most significant bit, the column enable outputs C2 and C3 at lines 64c and 64d are next enabled. Similarly, the remaining column enable outputs C4 through C15 are selected in pairs as the column address is incremented using the binary count with A1 as the least significant bit and A3 as the most significant bit. This embodiment is illustrated in FIG. 8.

In a third example embodiment, the bit number is equal to four and bit select 70 enables SEL A0 at 72a and SEL A1 at 72b. Decoder 74 provides outputs which are selected by column address A2-A3. In this embodiment, each combination of address inputs A2-A3 at line 62 selects four column enable outputs at 64.

In a fourth example embodiment, the bit number is equal to eight and bit select 70 enables SEL A0 at 72a, SEL A1 at 72b and SEL A2 at 72c. Decoder 74 provides outputs which are selected by column address A3. In this embodiment, each state of address A3 at line 62d selects eight column enable outputs at 64.

In the fifth embodiment, a high data transfer rate and high power consumption are selected for magnetic memory 10. In this embodiment, the bit number is equal to 16 and bit select 70 enables outputs SEL A0 at 72a, SEL A1 at 72b, SEL A2 at 72c and SEL A3 at 72d. All column enable outputs 64 of decoder 74 are enabled and 16 bit lines 18 are conducting current from current source 36 or current source 42.

In other embodiments, the bit number at line 60 can be any suitable number which configures magnetic memory 10 for a desired data transfer rate and level of power consumption.

In the exemplary embodiment, the bit number register illustrated in FIG. 1 stores the bit number. In other embodiments, the bit number at line 60 is stored within memory cells 14. In one embodiment, the bit number register 58 as located external to magnetic memory 10 and is coupled to magnetic memory 10 via the line 60. In this embodiment, bit number register 58 can be any storage device which includes, but is not limited to, another magnetic memory 10. In various embodiments, bit number register 58 is not used and the bit number is provided to line 60 by circuits located within magnetic memory 10 or located external to magnetic memory 10.

In one embodiment, an external monitor is used to determine if magnetic memory 10 is functioning on power provided by a battery source or by power provided from a wall receptacle. In this embodiment, if the power is provided from a wall receptacle, the external monitor provides a higher value bit number corresponding to higher data transfer rates and higher power consumption. If magnetic memory 10 is receiving power provided by a battery source, the external monitor provides a lower value bit number corresponding to lower data transfer rates and lower power consumption. In one embodiment, the monitor is located within magnetic memory 10.

In various embodiments, the bit number is used when reading or writing magnetic memory 10. In various embodiments, the bit number can be changed dynamically as data transfer rate and power consumption requirements change.

Figure 5:
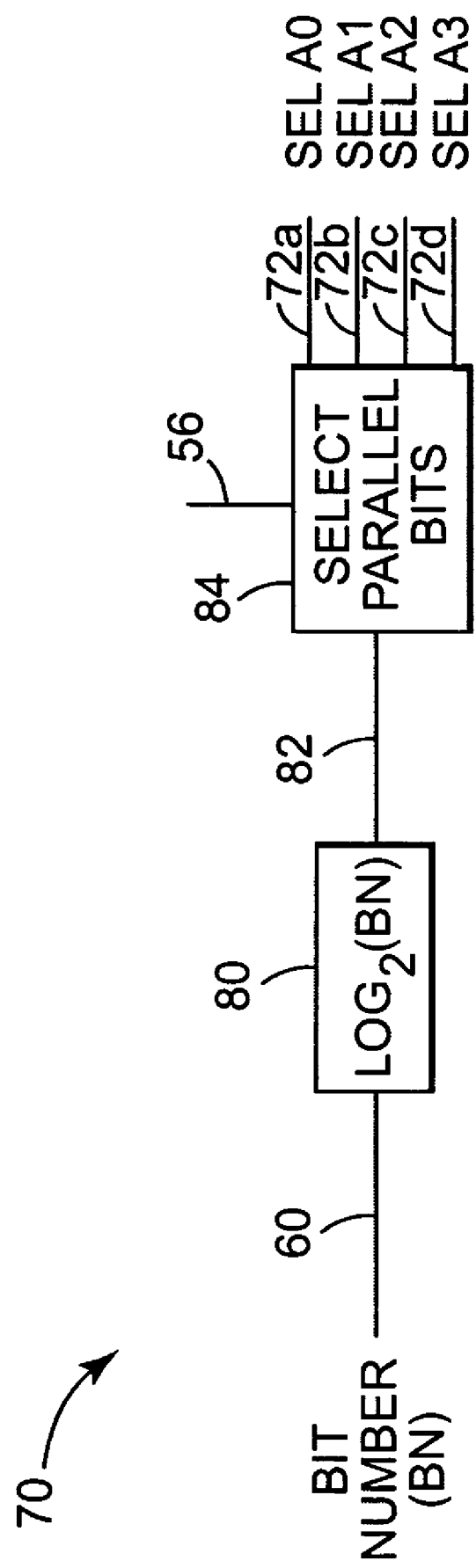
FIG. 5 is a diagram illustrating an exemplary embodiment of a bit select logic circuit.

FIG. 5 is a diagram illustrating an exemplary embodiment of a bit select logic circuit 70. Bit select logic circuit 70 includes conversion logic 80 which is configured to convert the bit number provided as an input at line 60 into a bit select number which is provided at an output 82. In the illustrated embodiment, the bit select number is equal to a logarithm of the bit number (BN) with respect to a base two. In various embodiments, any suitable logic can be used to convert the bit number at line 60 to the bit select number at line 82.

In the exemplary embodiment, bit select logic circuit 70 also includes select logic 84 which is configured to decode the bit select number at 82 into address select bit outputs at 72. Four address select bit outputs are illustrated as SEL A0 at 72a through SEL A3 at 72d. In the exemplary embodiment, the bit select number has a value which is between zero and four and selects corresponding least significant address select bit outputs at 72. Bit select logic circuit 70 is coupled to control system 52 via line 56.

In one example embodiment, the select bit at line 82 has a value of zero and none of the select bit outputs at 72 are enabled and are at a logic "0". In a second example embodiment, the select bit at line 82 has a value of one and the corresponding least significant select bit SEL A0 at 72a is enabled and is at a logic "1". In a third example embodiment, the select bit has a value of two and corresponding least significant select bit outputs SEL A0 at line 72a and SEL A1 at 72b are both enabled and are at a logic "1". In a fourth example embodiment, the select bit has a value of three and corresponding least significant select bit outputs SEL A0 at line 72a, SEL A1 at 72b and SEL A2 at 72c are enabled and are at a logic "1". In a fifth exemplary embodiment, the select bit has a value of four and corresponding least significant select bit outputs SEL A0 at line 72a, SEL A1 at 72b, SEL A2 at 72c and SEL A3 at line 72d are enabled and are all at a logic "1".

Figure 6:
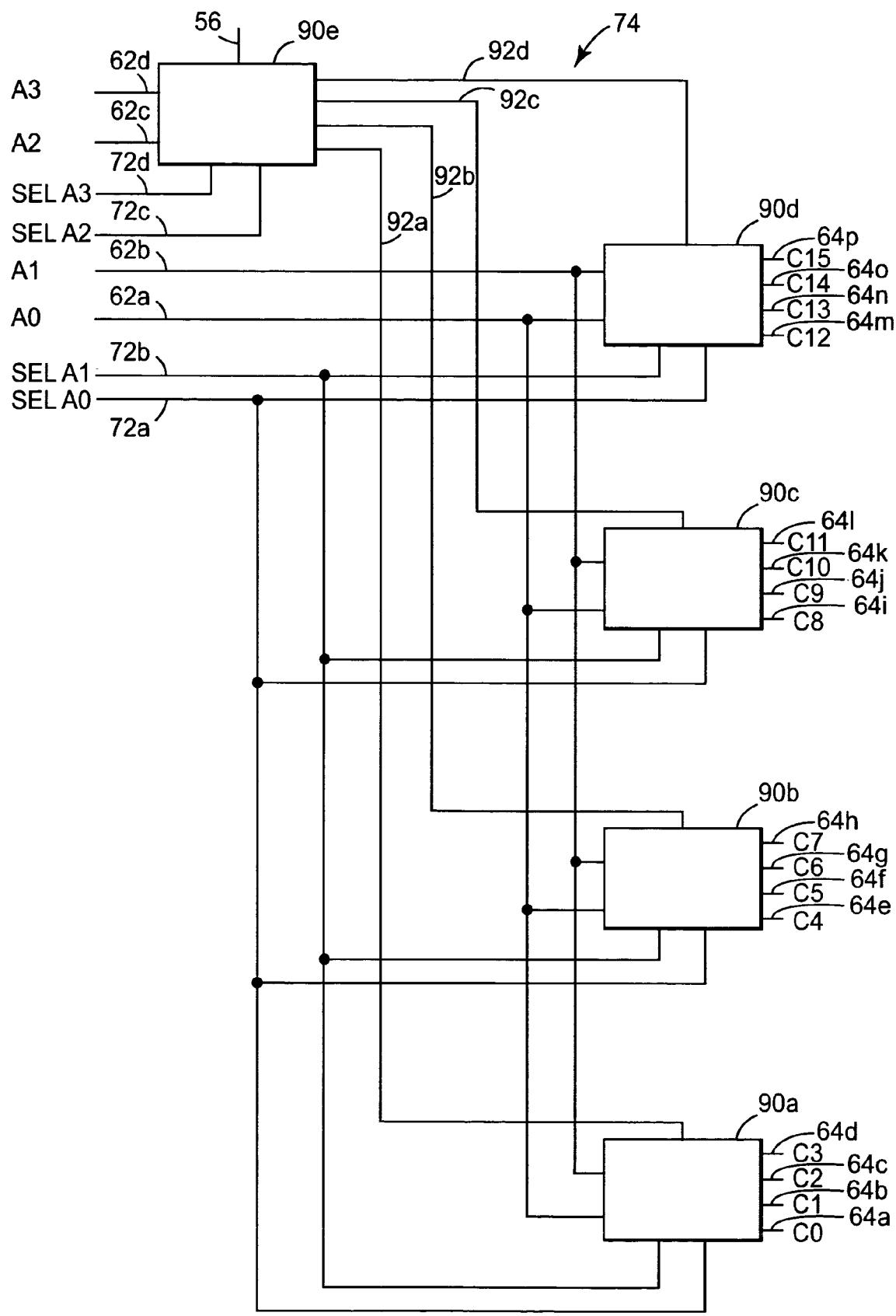
FIG. 6 is a diagram illustrating an exemplary embodiment of a decoder.

FIG. 6 is a diagram illustrating an exemplary embodiment of a decoder 74. Decoder 74 includes five 2:4 line decoders 90. Each 2:4 line decoder 90 decodes two address inputs at 62 and two address select bit inputs at 72 into column enable outputs at 64. The 2:4 line decoders 90 are described in more detail in FIG. 7.

In FIG. 6, 2:4 line decoder 90a has address inputs A0 at 62a and A1 at 62b and has address select bit inputs SEL A0 at 72a and SEL A1 at 72b and provides column enable outputs C0-C3 at outputs 64a-64d. The 2:4 line decoder 90b has address inputs A0 at 62a and A1 at 62b and has address select bit inputs SEL A0 at 72a and SEL A1 at 72b and provides column enable outputs C4-C7 at outputs 64e-64h. The 2:4 line decoder 90c has address inputs A0 at 62a and A1 at 62b and has address select bit inputs SEL A0 at 72a and SEL A1 at 72b and provides column enable outputs C8-C11 at outputs 64i-64l. The 2:4 line decoder 90d has address inputs A0 at 62a and A1 at 62b and has address select bit inputs SEL A0 at 72a and SEL A1 at 72b and provides column enable outputs C12-C15 at outputs 64m-64p.

The select inputs 92 to each 2:4 line decoder 90a through 90d is provided by 2:4 line decoder 90e. The 2:4 line decoder 90e has address inputs A2 at 62c and A3 at 62d and has address select bit inputs SEL A2 at 72*c* and SEL A3 at 72*d*. The 2:4 line decoder 90*e* provides the select outputs at 92*a*-92*d*. In the illustrated embodiment, as the binary count of A0-A3 is increased, the 2:4 line decoder 90*e* successively enables 2:4 line decoders 90*a*, 90*b*, 90*c*, and 90*d* in accordance with address inputs A2 and A3 at 62*c* and 62*d* and address select bit inputs SEL A2 and SEL A3 at lines 72*c* and 72*d*.

In other embodiments, decoder 74 can decode any suitable number of column address bits and any suitable number of address select bits into any suitable number of column enable outputs.

Figure 7:
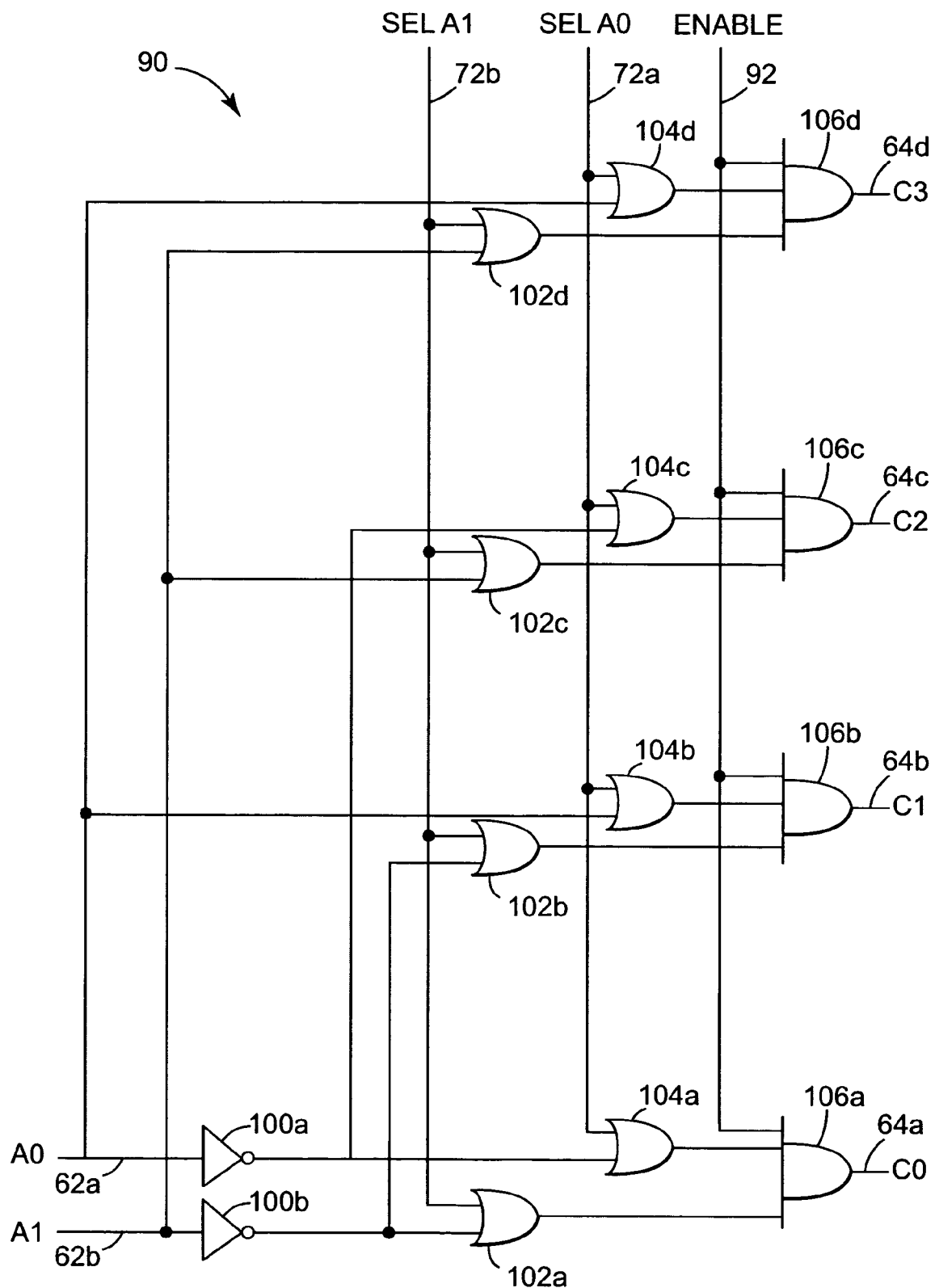
FIG. 7 is a diagram illustrating an exemplary embodiment of a 2:4 line decoder with select bit inputs.

FIG. 7 is a diagram illustrating an exemplary embodiment of a 2:4 line decoder 90 with select bit inputs. Column address input A0 at input 62*a* is coupled to an input of OR gate 104*b* and an input of OR gate 104*d*. Inverter 100*a* has column address A0 as an input and provides an inverted column address A0 signal as an input to OR gate 104*a* and OR gate 104*c*. Column address A1 at 62*b* is coupled to an input of OR gate 102*c* and an input of OR gate 102*d*. Inverter 100*b* has column address A1 as an input and provides an inverted column address A1 signal as an input to OR gate 102*a* and OR gate 102*b*.

NAND gates 106 provide column enable outputs C0 at 64*a* through C3 at 64*d*. NAND gate 106*a* has an enable input at 92, an output of OR gate 102*a* as an input and an output of OR gate 104*a* as an input, and provides a logic "1" column enable output C0 at 64*a* when all the inputs are at a logic "1". NAND gate 106*b* has an enable input at 92, an output of OR gate 102*b* as an input and an output of OR gate 104*b* as an input, and provides a logic "1" column enable output C1 at 64*b* when all the inputs are at a logic "1". NAND gate 106*c* has an enable input at 92, an output of OR gate 102*c* as an input and an output of OR gate 104*c* as an input, and provides a logic "1" column enable output C2 at 64*c* when all the inputs are at a logic "1". NAND gate 106*d* has an enable input at 92, an output of OR gate 102*d* as an input and an output of OR gate 104*d* as an input, and provides a logic "1" column enable output C3 at 64*d* when all the inputs are at a logic "1".

Each OR gate 102 and 104 includes one column address input (either A0 or A1) and one address select bit input (either SEL A0 or SEL A1). The SEL A0 input enables OR gates 104 to provide a logic "1" output to AND gates 106 irrespective of the state of column addresses A0 or A1. The SEL A1 input enables OR gates 102 to provide a logic "1" output to AND gates 106 irrespective of the state of column addresses A0 or A1. If SEL A0 is at a logic "1", SEL A1 is at a logic "0" and the enable input at 92 is at a logic "1", the outputs of AND gates 64 depends only on the outputs of OR gates 102. If SEL A0 is at a logic "0", SEL A1 is at a logic "1" and the enable input at 92 is at a logic "1", the outputs of AND gates 64 depends only on the outputs of OR gates 104. If both SEL A0 and SEL A1 are at a logic "1" and the enable input at 92 is at a logic "1", all NAND gates 64 will have outputs at a logic "1" and column enable outputs C0 through C4 will enable four corresponding transistors 66.

If both SEL A0 and SEL A1 are at a logic "0" and the enable input at 92 is at a logic "1", AND gate 106*a* will provide an output which is a logic "1" when column address inputs A0 and A1 are at a logic "0". If both SEL A0 and SEL A1 are at a logic "0" and the enable input at 92 is at a logic "1", AND gate 106*b* will provide an output which is a logic "1" when column address input A0 is at a logic "1" and column address input A1 is at a logic "0". If both SEL A0 and SEL A1 are at a logic "0" and the enable input at 92 is at a logic "1", AND gate 106*c* will provide an output which is a logic "1" when column address input A0 is at a logic "0" and column address input A1 is at a logic "1". If both SEL A0 and SEL A1 are at a logic "0" and the enable input at 92 is at a logic "1", AND gate 106*d* will provide an output which is a logic "1" when column address inputs A0 and A1 are at a logic "1".

In other embodiments, other suitable decoder configurations can be used. For example, in one embodiment, 11 address bits and 11 select bits can be decoded into 2,048 column enable outputs. In other embodiments, any suitable number of address bits and address select bits can be decoded into a corresponding suitable number of column enable outputs.

FIG. 8 is a diagram illustrating one embodiment of a bit number decoded into column enable outputs. The diagram is illustrated generally at 120. The column address inputs A0-A3 are illustrated at 122 and the column enable outputs C0-C15 are illustrated at 124.

In the illustrated embodiment, address bit A0 is enabled by the address select bit SEL A0. Each combination of column addresses A0-A3 turns on two transistors 66 via two column enable outputs at 64. Referring to FIGS. 6 and 7, two column enable outputs at 64 are selected for each combination of column addresses A0-A3 because address select bit SEL A0 at 72*a* enables OR gates 104 and column addresses A1-A3 select column enable outputs C0-C15. FIG. 8 illustrates each combination of addresses A0-A3 selecting two column enable outputs at 130.

If the four column address inputs A0-A3 are all at a logic "0", column enable outputs C0 and C1 are both selected and are at a logic "1". Because each combination of column address bits A1-A3 selects two column enable outputs, only 8 cycles or combinations of address bits A1-A3 are needed to select the 16 column enable outputs C0-C15.

What is claimed is:

1. A memory storage device, comprising:
   memory cells;
   an address control system configured to decode a bit number which identifies a number of the memory cells selected in parallel, wherein the number of the memory cells selected in parallel correspond to least significant bits of an address which has a range that includes the memory cells wherein the address control system comprises bit select logic configured to decode the bit number into address select bits wherein the bit select logic includes conversion logic configured to convert the bit number into a bit select number which is equal to a logarithm of the bit number with respect to a base two and select logic configured to enable a number of address select bits which are equal to the bit select number, wherein each address select bit corresponds to a bit of the address, and wherein the number of address select bits enabled correspond to the least significant bits of the address; and
   a decoder configured to decode the address into column enable outputs, wherein the address select bits enable the column enable outputs which correspond to the least significant bits of the address.

2. The memory storage device of claim 1, comprising:
   a bit number register configured to store the bit number.

3. The memory storage device of claim 2, wherein the bit number register includes at least one of the memory cells.

4. The memory storage device of claim 1, wherein the bit number is equal to or less than a number of bits in the address.

5. The memory storage device of claim 4, wherein the bit number is equal to two raised to a power.

6. A magnetic memory comprising:
an array of memory cells;
an array of bit lines extending in a first direction which intersect the array of memory cells;
an array of word lines extending in a second direction which intersect the array of memory cells; and
an address control system coupled to the array of bit lines to decode a bit number which identifies a number of bit lines which are selected in parallel, wherein the bit lines selected in parallel correspond to least significant bits of an address which has a range that includes the array of bit lines wherein the address control system comprises a bit select circuit configured to decode the bit number into address select bits, wherein the bit select circuit includes conversion logic configured to convert the bit number into a bit select number which is equal to a logarithm of the bit number with respect to a base two and select logic configured to enable a number of address select bits which are equal to the bit select number, the address control system further comprising a decoder configured to decode the address into bit enable outputs, wherein the address select bits enable the bit enable outputs which correspond to the least significant bits of the address.

7. The magnetic memory of claim 6, comprising:
a bit number register configured to store the bit number.

8. The magnetic memory of claim 7, wherein the bit number register includes at least one memory cell in the array of memory cells.

9. The magnetic memory of claim 6, wherein the bit number is equal to or less than a number of bits in the address.

10. The magnetic memory of claim 9, wherein the bit number is equal to two raised to a power.

11. A magnetic memory comprising:
memory cells; and
an address control means configured to decode a bit number which identifies a number of the memory cells which are selected in parallel, wherein the address control means comprises
  bit select means configured to decode the bit number into address select bits wherein the bit select means includes conversion means configured to convert the bit number into a bit select number which is equal to a logarithm of the bit number with respect to a base two and select means configured to enable a number of address select bits which are equal to the bit select number, wherein each address select bit corresponds to a bit of the address, and wherein the number of address select bits enabled correspond to the least significant bits of the address and
  a decoder means configured to decode the address into column enable outputs, wherein the address select bits enable the column enable outputs which correspond to the least significant bits of the address,
wherein the memory cells selected in parallel correspond to least significant bits of an address which has a range that includes the memory cells.

12. An address control system for a memory storage device, wherein the memory storage device includes an array of memory cells and an array of bit lines which intersect the array of memory cells, comprising:
a bit select circuit configured to decode a bit number which identifies a number of bit lines which are selected in parallel, wherein the bit lines selected in parallel correspond to least significant bits of an address which has a range that includes the array of bit lines, and wherein the bit select circuit decodes the bit number into address select bits, the bit select circuit including
  a conversion circuit configured to convert the bit number into a bit select number which is equal to a logarithm of the bit number with respect to a base two; and
  a select circuit configured to enable a number of address select bits which are equal to the bit select number wherein each address select bit corresponds to a bit of the address, and wherein the number of address select bits enabled correspond to the least significant bits of the address; and
a decoder circuit coupled to the array of bit lines configured to decode the address into bit enable outputs, wherein the address select bits enable the bit enable outputs which correspond to the least significant bits of the address.

13. The address control system of claim 12, comprising:
a bit number register configured to store the bit number.

14. The address control system of claim 13, wherein the bit number register includes at least one memory cell in the array of memory cells.

15. The address control system of claim 12, wherein the bit number is equal to or less than a number of bits in the address.

16. The address control system of claim 15, wherein the bit number is equal to two raised to a power.

17. A method of selecting two or more of at least two memory cells in a memory storage device, comprising:
decoding a bit number which identifies a number of the memory cells which are selected in parallel wherein decoding the bit number comprises converting the bit number into a bit select number which is equal to a logarithm of the bit number with respect to a base two and enabling a number of address select bits which are equal to the bit select number, wherein each address select bit corresponds to a bit of the address, and wherein the number of address select bits enabled correspond to the least significant bits of the address;
decoding the bit number into address select bits decoding; and
decoding the address into column enable outputs, wherein the address select bits enable the column enable outputs which correspond to the least significant bits of the address, wherein the memory cells selected in parallel correspond to least significant bits of an address which has a range that includes the memory cells.

18. The method of claim 17, including:
decoding the bit number into address select bits; and
decoding the address into column enable outputs, wherein the address select bits enable the column enable outputs which correspond to the least significant bits of the address.

* * * * *